(12) United States Patent
Nagatani et al.

(10) Patent No.: US 11,070,219 B2
(45) Date of Patent: Jul. 20, 2021

(54) DIGITAL/ANALOG CONVERTER

(71) Applicant: Nippon Telegraph and Telephone Corporation, Tokyo (JP)

(72) Inventors: Munehiko Nagatani, Tokyo (JP); Hideyuki Nosaka, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 15/734,411

(22) PCT Filed: May 16, 2019

(86) PCT No.: PCT/JP2019/019492
§ 371 (c)(1),
(2) Date: Dec. 2, 2020

(87) PCT Pub. No.: WO2019/235162
PCT Pub. Date: Dec. 12, 2019

(65) Prior Publication Data
US 2021/0167786 A1 Jun. 3, 2021

(30) Foreign Application Priority Data
Jun. 5, 2018 (JP) .............................. JP2018-107629

(51) Int. Cl.
*H03M 1/06* (2006.01)
*H03M 1/10* (2006.01)
(Continued)

(52) U.S. Cl.
CPC ............ *H03M 1/06* (2013.01); *H03M 1/1009* (2013.01); *H03M 1/1023* (2013.01); *H03M 1/66* (2013.01); *H03M 1/747* (2013.01)

(58) Field of Classification Search
CPC ...... H03M 1/06; H03M 1/1009; H03M 1/747; H03M 1/66; H03M 1/1023
(Continued)

(56) References Cited

U.S. PATENT DOCUMENTS

2012/0007757 A1 * 1/2012 Choe .................. H03M 1/1061
341/120

FOREIGN PATENT DOCUMENTS

| JP | S58050531 U | 4/1983 |
| JP | S60100829 A | 6/1985 |
| JP | 2010004422 A | 1/2010 |

OTHER PUBLICATIONS

Nagatani et al., "Ultrahigh-Speed Low-Power DACs Using InP HBTs for Beyond-100-Gb/s/ch Optical Transmission Systems," IEEE Journal of Solid-State Circuits, vol. 46, No. 10, Oct. 2011, pp. 2215-2225.

* cited by examiner

*Primary Examiner* — Joseph J Lauture
(74) *Attorney, Agent, or Firm* — Slater Matsil, LLP

(57) ABSTRACT

A digital-to-analog converter includes a core circuit including a plurality of input terminals for multi-bit digital signals, an output terminal for an analog signal, a plurality of constant current sources, a plurality of switch circuits connected in series to respective constant current sources of the plurality of constant current sources, and a load resistor connected to the output terminal. The core circuit being configured to select whether or not to allow a current to flow through each of the plurality of switch circuits based on the multi-bit digital signals and output a voltage generated by allowing the current flowing through each of the plurality of switch circuits to flow through the load resistor from the output terminal as an analog signal.

16 Claims, 9 Drawing Sheets

(51) Int. Cl.
*H03M 1/74* (2006.01)
*H03M 1/66* (2006.01)

(58) Field of Classification Search
USPC ......... 341/118, 120, 144, 136; 327/543, 408
See application file for complete search history.

DIGITAL/ANALOG CONVERTER

CROSS-REFERENCE TO RELATED APPLICATIONS

This application is a national phase entry of PCT Application No. PCT/JP2019/019492, filed on May 16, 2019, which claims priority to Japanese Application No. 2018-107629, filed on Jun. 5, 2018, which applications are hereby incorporated herein by reference.

TECHNICAL FIELD

The present invention relates to a digital-to-analog converter that converts a digital signal to an analog signal.

BACKGROUND

In recent years, multi-value modulation technologies such as pulse amplitude modulation (PAM) have been introduced vigorously to increase communication capacity. Functional circuits that convert a plurality of digital signals (binary signals) to one analog signal (multi-value signal) called "digital-to-analog converters" when generating modulated signals are commonly used in transmitters for transmission systems using such multi-value modulation.

Configuration examples of common digital-to-analog converters are shown in FIG. 14 and FIG. 15. Here, configuration examples of a digital-to-analog converter that can convert a 2-bit digital signal to a 4-value analog signal are illustrated for simplicity of description. However, to be precise, switch circuits described in FIG. 14 and FIG. 15 are constructed of transistor differential pairs or the like.

The digital-to-analog converter in FIG. 14 selectively switches whether or not to allow a binary-weighted current to flow through a load resistor by a digital signal and generates an analog signal current in accordance with the digital signal using additivity of current. The current generated is extracted as an analog voltage signal using a voltage drop at the load resistor. FIG. 15 illustrates a configuration in which it is selectively switched whether or not to allow a current having the same value to flow through a resistor ladder made up of R and 2R in accordance with a digital signal, the R-2R resistor ladder unit carries out binary weighted addition and eventually extracts an analog voltage signal from an output terminal. Both circuits in FIGS. 14 and 15 generate an analog signal from a digital signal using additivity of current and are called "current steering type digital-to-analog converters."

In the case of an application requiring high-speed conversion, timing of selectively switching currents, that is, timings of rising and falling edges of a plurality of digital signals needs to be aligned in time in these circuits, and thus a timing adjustment circuit having a retiming function such as a DFF (D flip-flop) is disposed immediately before the core circuit and processing of aligning timings of multi-bit digital signals using a clock signal is performed. Furthermore, a technique for more exactly aligning timings in consideration of a difference in wiring length of clock distribution or the like caused by a layout arrangement is also reported (e.g., see Non-Patent Literature 1).

CITATION LIST

Non-Patent Literature

Non-Patent Literature 1: M. Nagatani et al. "Ultrahigh-Speed Low-Power DACs Using InP HBTs for Beyond-100-Gb/s/ch Optical Transmission Systems", IEEE JSSC, vol. 46, No. 10, October 2011.

SUMMARY

Technical Problem

However, in a speed region of very fast conversion speed, for example, a conversion speed exceeding 100 GS/s, there has been a problem that even when timings of rising and falling edges of a digital signal are aligned at driving points of the switch circuit, influences of difference in propagation delay in each signal path caused by a circuit layout or the like become tangible inside the core circuit of the digital-to-analog converter, eventually resulting in a problem that an analog signal waveform to be outputted is distorted.

Embodiments of the present invention have been made in view of the above-described problems and it is an object of embodiments of the present invention to provide a digital-to-analog converter capable of generating an analog signal with less distortion even during an ultra-high speed conversion operation.

Means for Solving the Problem

In order to solve the above-described problems, a digital-to-analog converter of embodiments of the present invention includes a core circuit including a plurality of input terminals for multi-bit digital signals, an output terminal for an analog signal, a plurality of constant current sources, a plurality of switch circuits connected in series to respective constant current sources of the plurality of constant current sources, and a load resistor connected to the output terminal, the core circuit being configured to select whether or not to allow a current to flow through each of the plurality of switch circuits based on the multi-bit digital signals and output a voltage generated by allowing the current flowing through each of the plurality of switch circuits to flow through the load resistor from the output terminal as an analog signal, a plurality of timing adjustment circuits disposed between respective input terminals of the plurality of input terminals and respective switch circuits of the plurality of switch circuits and configured to adjust timing of inputting the digital signals to each of the plurality of switch circuits and an adjustment circuit configured to adjust timing of inputting the digital signals to each of the plurality of switch circuits so as to offset a difference in a propagation time of a signal from each of the plurality of switch circuits to the output terminal.

The plurality of timing adjustment circuits may operate based on a clock signal and the adjustment circuit may adjust timing of inputting the clock signal to the plurality of timing adjustment circuits so as to offset a difference in a propagation time of a signal from each of the plurality of switch circuits to the output terminal.

The adjustment circuit may be a clock signal wire that inputs the clock signal to the timing adjustment circuit.

The adjustment circuit may be a phase shifter installed between the input terminal of the clock signal and the timing adjustment circuit.

The adjustment circuit may be a signal wire between the timing adjustment circuit and the switch circuit.

The adjustment circuit may be a phase shifter installed between the timing adjustment circuit and the switch circuit.

Each of the plurality of switch circuits may be a differential switch circuit with two switch elements connected to each of the plurality of constant current sources.

Each of the plurality of timing adjustment circuits may be a D flip-flop circuit or a multiplexer circuit.

Effects of embodiments of the Invention

According to embodiments of the present invention, it is possible to provide a digital-to-analog converter capable of generating an analog signal with less distortion even during an ultra-high speed conversion operation.

DETAILED DESCRIPTION OF ILLUSTRATIVE EMBODIMENTS

Hereinafter, embodiments of the present invention will be described with reference to the accompanying drawings. However, the present invention can be implemented in many different modes, and the present invention should not be construed as limited to the embodiments of the present invention, which will be described hereinafter.

First Embodiment

Figure 1:
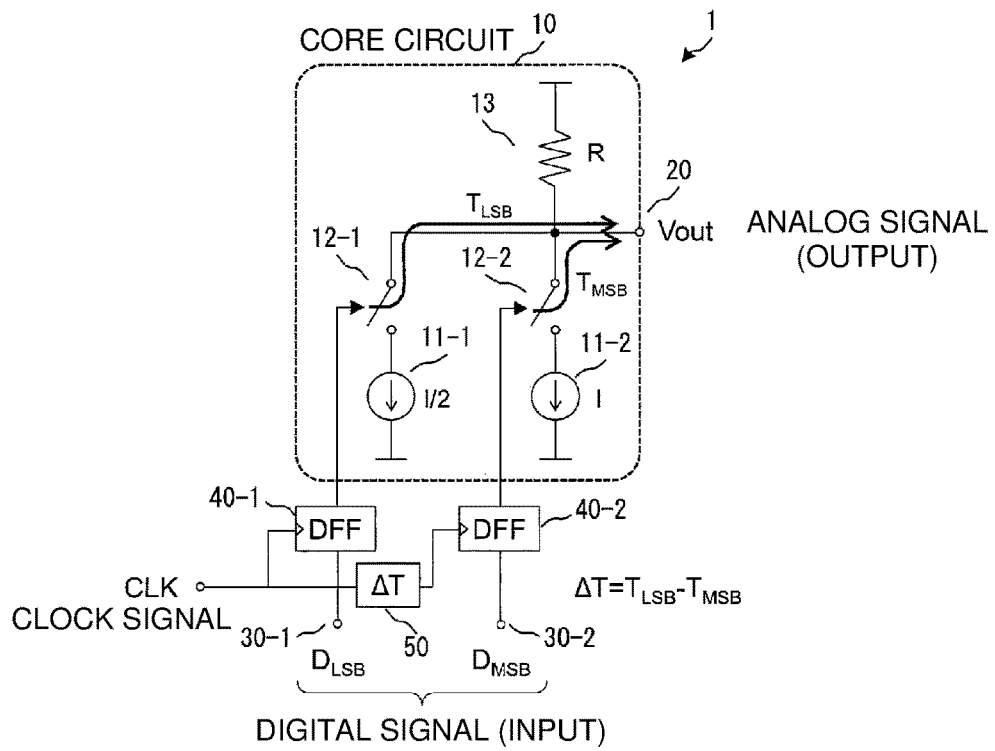
FIG. 1 is a diagram illustrating a configuration example of a digital-to-analog converter according to a first embodiment of the present invention.
Figure 2:
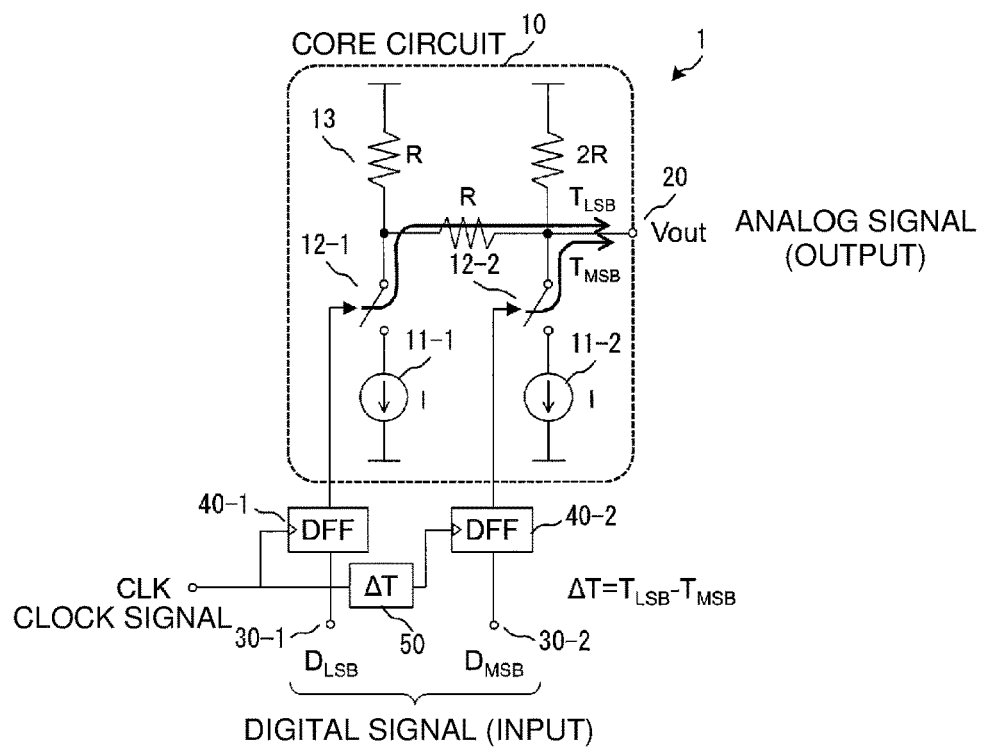
FIG. 2 is a diagram illustrating another configuration example of the digital-to-analog converter according to the first embodiment of the present invention.

FIG. 1 and FIG. 2 illustrate configuration examples of a digital-to-analog converter according to a first embodiment of the present invention. FIG. 1 and FIG. 2 illustrate configuration examples of the digital-to-analog converter that converts a 2-bit digital signal to an analog signal. Note that the configuration examples in FIGS. 1 and 2 correspond to configuration examples of conventional digital-to-analog converters in FIG. 14 and FIG. 15 respectively.

A digital-to-analog converter 1 of the present embodiment is provided with two constant current sources (11-1, 11-2), two switch circuits (12-1, 12-2) connected in series to constant current sources of the two constant current sources respectively, a plurality of input terminals (30-1, 30-2) for 2-bit digital signals, an output terminal 20 for an analog signal, a core circuit 10 connected to the output terminal 20 and having a load resistor 13, and two timing adjustment circuits (40-1, 40-2) disposed between each of the two input terminals (30-1, 30-2) and each of the two switch circuits (12-1, 12-2) and configured to adjust timing of inputting a digital signal to each switch circuit. In the present embodiment, the timing adjustment circuits (40-1, 40-2) are constructed of D flip-flop circuits (DFF).

The digital-to-analog converter 1 of the present embodiment is similar to the conventional one in that it is selected whether or not to allow a current to flow into each switch circuit (12-1, 12-2) based on a 2-bit digital signal and a voltage generated by allowing the current flowing into each switch circuit to flow through the load resistor 13 is outputted from the output terminal 20 as an analog signal. However, in the present embodiment, since an adjustment circuit 50 is provided which gives such a time difference $\Delta T$ as to offset a difference in a propagation time of signals flowing through the respective switch circuits (12-1, 12-2) generated inside the core circuit 10 of the digital-to-analog converter 1 to digital signals for driving the switch circuits (12-1, 12-2), the output terminal 20 is configured to offset the difference in the propagation time inside the core circuit 10 and prevent waveform distortion during an ultra-high speed conversion operation.

More specifically, such a circuit configuration is adopted that the adjustment circuit 50 is provided, which gives $\Delta T$ ($T_{LSB}-T_{MSB}$), which is a difference between a signal propagation time $T_{MSB}$ on an MSB (most significant bit) side close to the output terminal 20 (Vout) and a signal propagation time $T_{LSB}$ on an LSB (least significant bit) side far from the output terminal 20 of the input terminals (30-1, 30-2) for the 2-bit digital signal as a time difference of clock signal inputs to the DFFs (40-1, 40-2) disposed between the switch circuits (12-1, 12-2) of the core circuit 10 and each input terminal of the plurality of digital signals so that a digital signal D $L_{SB}$ on the LSB side arrives at the switch circuit (12-1) earlier than the digital signal $D_{MSB}$ on the MSB side by ΔT. The signal propagation time $T_{MSB}$ is a time period after a digital signal $D_{MSB}$ on the MSB side drives the switch circuit until a voltage change occurs in Vout corresponding to the signal. The signal propagation time $T_{LSB}$ is a time period after a digital signal $D_{LSB}$ on the LSB side drives the switch circuit until a voltage change occurs in Vout corresponding to the signal.

Such a configuration makes it possible to adjust timing of inputting digital signals to each of the switch circuits (12-1, 12-2) so as to offset a difference in a propagation time of a signal from each of the switch circuits (12-1, 12-2) to the output terminal, generated inside the core circuit 10 of the digital-to-analog converter 1. Note that the aforementioned signal propagation times $T_{MSB}$ and $T_{LSB}$ are values known at a design stage of the core circuit, and an input time difference of clock signals to the DFFs may be adjusted in accordance with the values. The same will also be applied to other embodiments, which will be described later.

Here, the adjustment circuit 50 that gives an input time difference ΔT of clock signals to the DFFs (40-1, 40-2) may be implemented by adopting such a layout that a clock signal wire to the DFF (40-2) on the MSB side is physically made longer than a clock signal wire to the DFF (40-1) on the LSB side by the time difference ΔT. Alternatively, the adjustment circuit 50 may also be configured such that a phase shifter or phase shifters is/are disposed for one or both of the clock signal wires to the DFFs (40-1, 40-2) so as to give a desired time difference ΔT by adjusting phases of the clock signals to be inputted to the respective DFFs.

It may also be possible to give clock signals to the respective DFFs (40-1, 40-2) simultaneously, change signal wiring lengths of digital signal paths between the switch circuits (12-1, 12-2) and the DFFs (40-1, 40-2) or install a phase shifter to thereby assign a desired time difference ΔT to the digital signals. However, since a variation may occur in the waveform quality of digital signals for driving the switch circuits (12-1, 12-2) in this case, the method of adjusting timing of inputting clock signals to the aforementioned DFFs is preferable.

Figure 3:
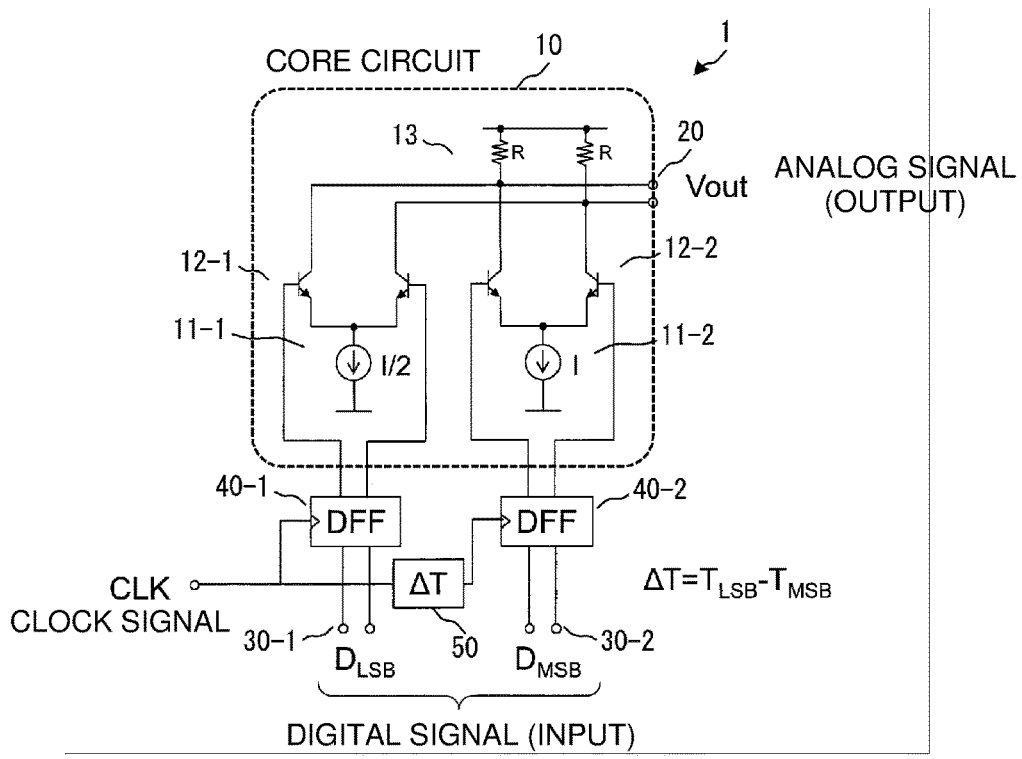
FIG. 3 is a diagram illustrating a further configuration example of the digital-to-analog converter according to the first embodiment of the present invention.
Figure 4:
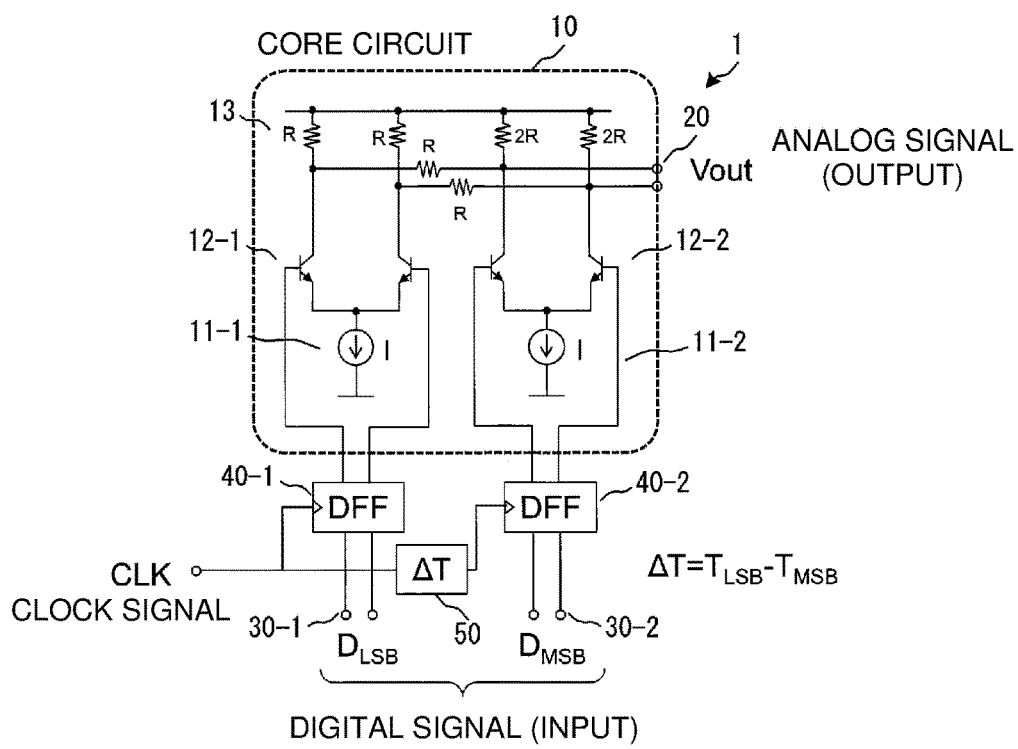
FIG. 4 is a diagram illustrating a further configuration example of the digital-to-analog converter according to the first embodiment of the present invention.

FIGS. 3 and 4 are diagrams illustrating further configuration examples of the digital-to-analog converter according to the first embodiment of the present invention. In FIGS. 3 and 4, the switch circuits (12-1, 12-2) of the core circuit 10 are each constructed of a differential switch circuit with two switch elements connected to the two constant current sources (11-1, 11-2) respectively. Note that although the switch circuits (12-1, 12-2) in FIGS. 3 and 4 are constructed of a differential pair using bipolar transistors, the switch circuits (12-1, 12-2) may be constructed of a differential pair using FETs (field-effect transistors).

Thus, according to the present embodiment, by giving such a delay as to offset a difference in a propagation time of a signal flowing through each switch circuit, generated inside the core circuit of the digital-to-analog converter to a digital signal for driving each switch circuit, it is possible to offset the difference in the propagation time inside the core circuit at the output terminal, and thereby prevent waveform distortion of analog signals during an ultra-high speed conversion operation.

Second Embodiment

Figure 5:
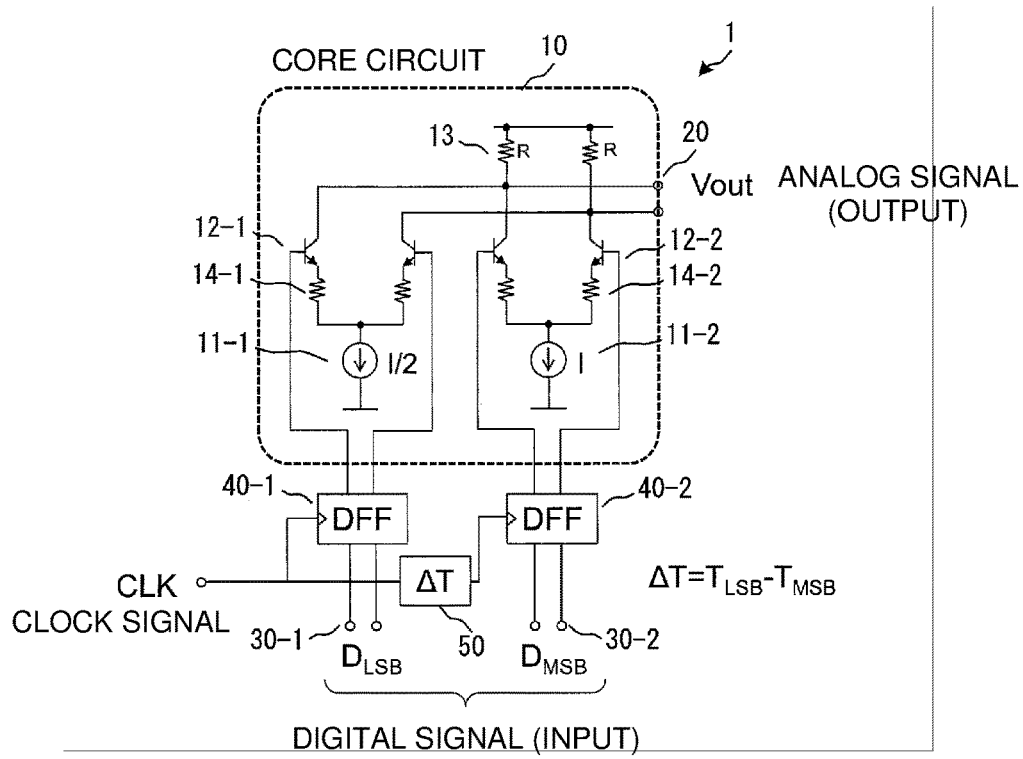
FIG. 5 is a diagram illustrating a configuration example of a digital-to-analog converter according to a second embodiment of the present invention.
Figure 6:
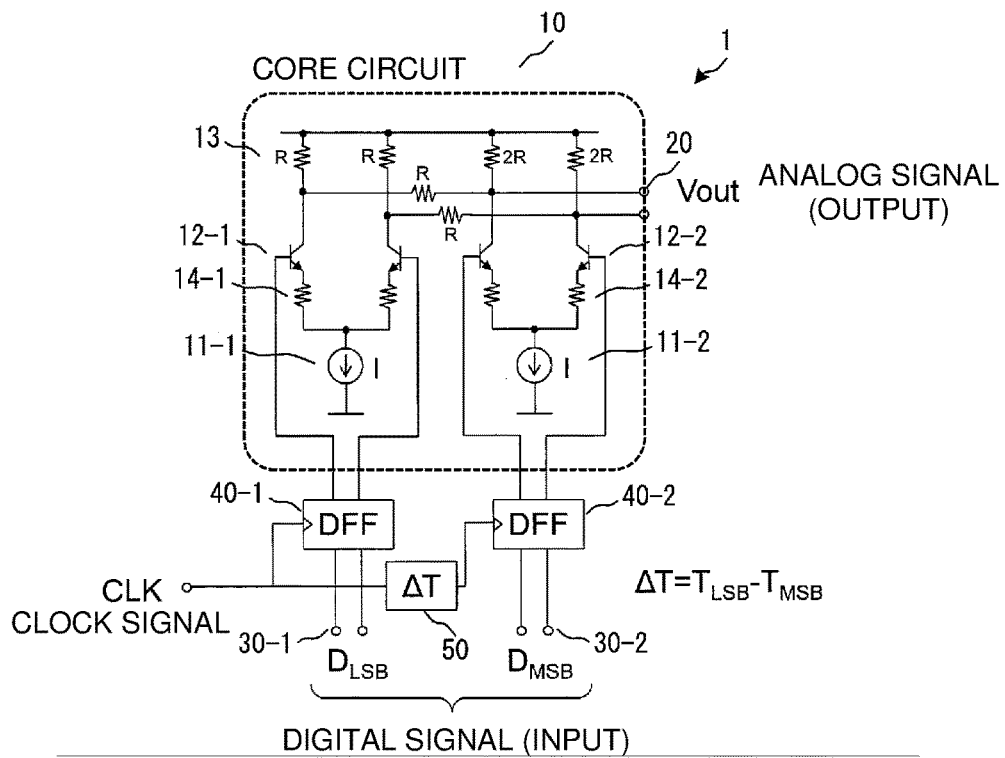
FIG. 6 is a diagram illustrating another configuration example of the digital-to-analog converter according to the second embodiment of the present invention.

FIGS. 5 and 6 are diagrams illustrating configuration examples of a digital-to-analog converter according to a second embodiment of the present invention. As shown in FIGS. 5 and 6, degenerative resistors (14-1, 14-2) may be inserted on emitter sides of differential pair transistors constituting a differential switch circuit. When the switch circuits (12-1, 12-2) are constructed of differential pairs using FETs, the degenerative resistors (14-1, 14-2) are inserted on the source sides of FETs.

Third Embodiment

Figure 7:
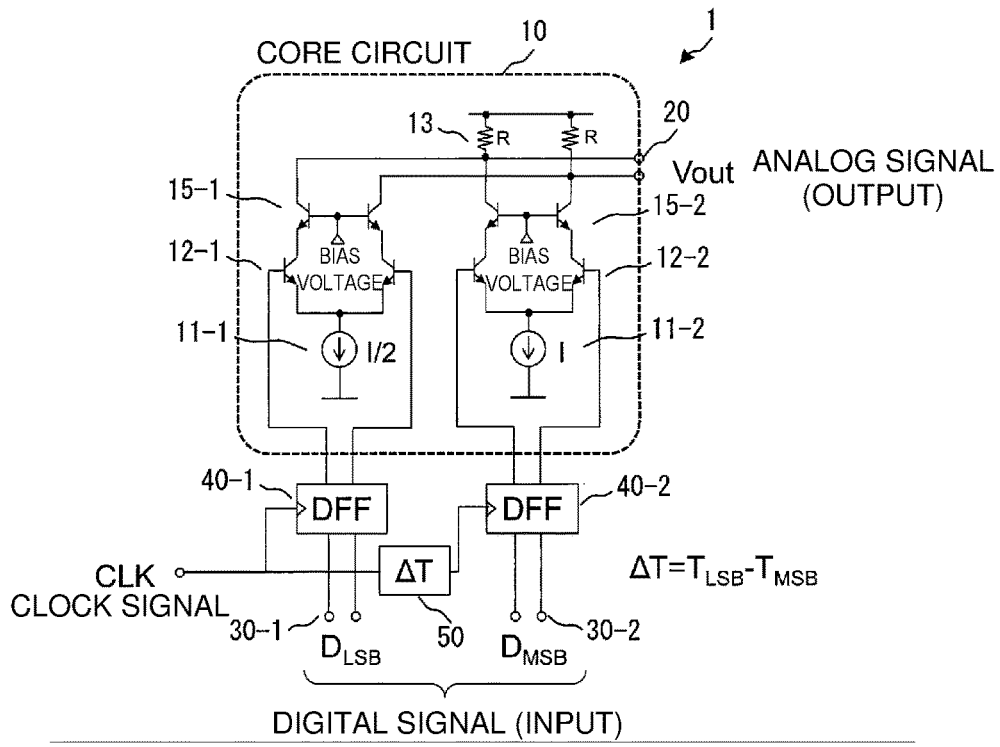
FIG. 7 is a diagram illustrating a configuration example of a digital-to-analog converter according to a third embodiment of the present invention.
Figure 8:
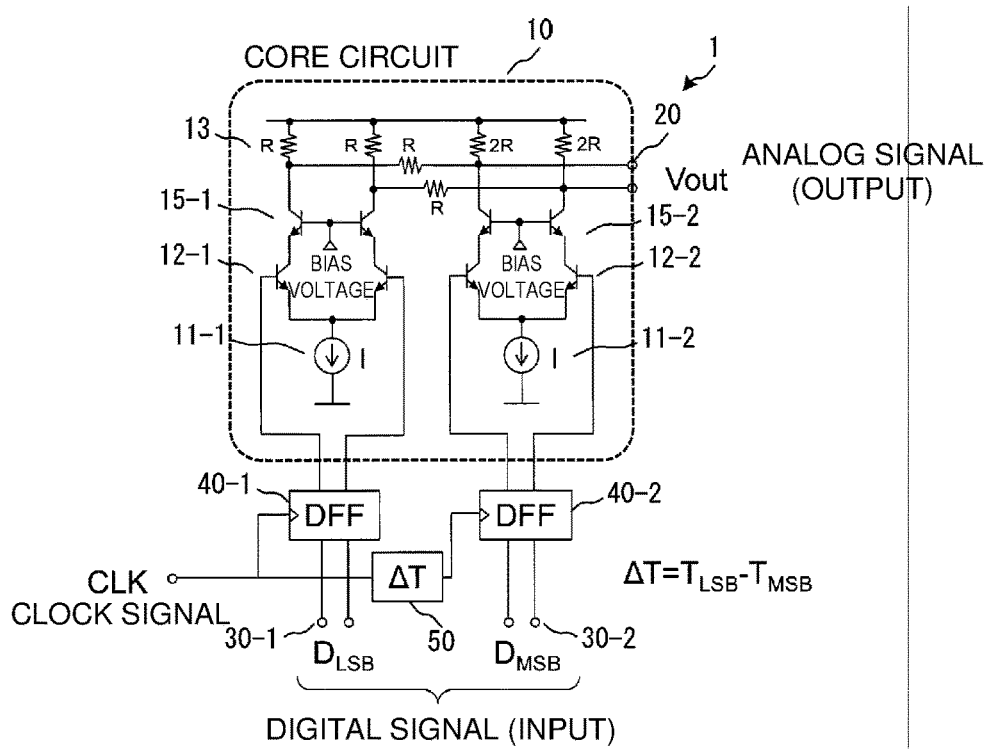
FIG. 8 is a diagram illustrating another configuration example of the digital-to-analog converter according to the third embodiment of the present invention.

FIGS. 7 and 8 are diagrams illustrating configuration examples of a digital-to-analog converter according to a third embodiment of the present invention. As shown in FIGS. 7 and 8, cascode transistors (15-1, 15-2) may be inserted on collector sides of differential pair transistors. When the switch circuits (12-1, 12-2) are constructed of a differential pair using FETs, the cascode transistors (15-1, 15-2) are inserted on drain sides of the FETs.

Fourth Embodiment

Figure 9:
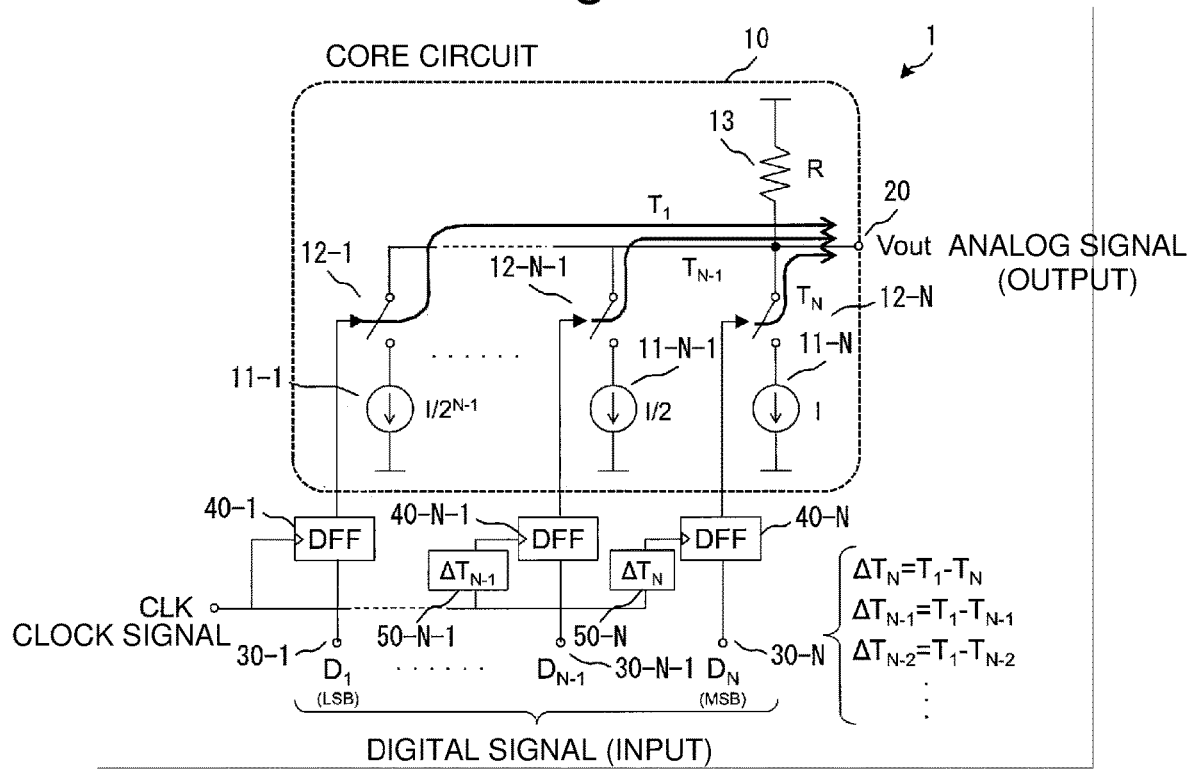
FIG. 9 is a diagram illustrating a configuration example of a digital-to-analog converter according to a fourth embodiment of the present invention.
Figure 10:
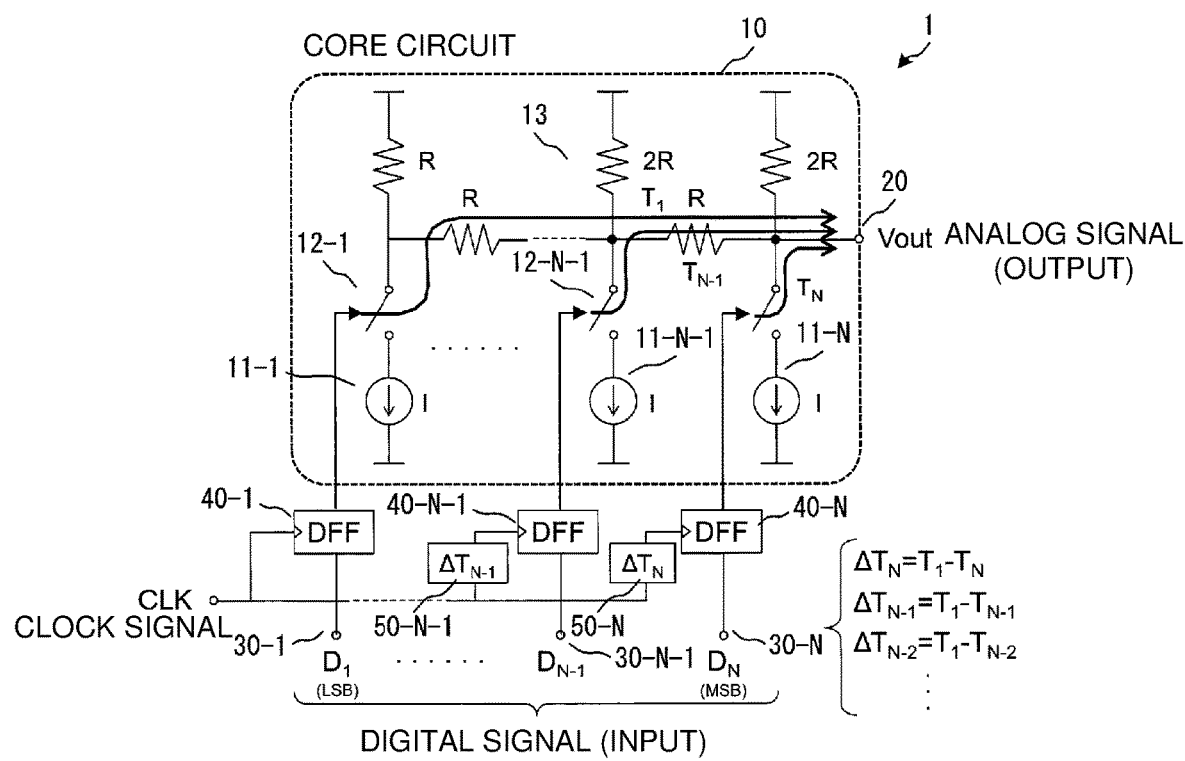
FIG. 10 is a diagram illustrating another configuration example of the digital-to-analog converter according to the fourth embodiment of the present invention.

In the aforementioned first to third embodiments, the configuration examples of the digital-to-analog converters that convert a 2-bit digital signal to an analog signal have been described, but embodiments of the present invention can be extended to multi-bit (with the number of bits exceeding 2) digital-to-analog converters. FIGS. 9 and 10 are configuration examples of an N-bit digital-to-analog converter according to a fourth embodiment of the present invention. The switch circuits (12-1 to 12-N) may be constructed of differential switch circuits using the transistor differential pairs described in FIG. 3 to FIG. 8.

As shown in FIGS. 9 and 10, by using timing of inputting a clock to a DFF (40-1) at LSB as a reference, an DFF (40-N) at MSB adjusts timing of inputting a clock signal so that the clock is inputted with a delay of $\Delta T_N (=T_1-T_N)$ and a DFF (40-N-1) at a second bit ($D_{N-1}$) from the MSB adjusts timing of inputting a clock signal so that the clock is inputted with a delay of $\Delta T_{N-1} (=T_1-T_{N-1})$. The same applies to timing of inputting a clock signal to other bits.

As in the case of the first embodiment, the adjustment circuits (50-N-1, 50-N) that give a time difference ΔT of clock signal input may also make adjustments by changing wiring lengths of clock signals to the DFFs (40-1 to 40-N) or may adjust the time difference ΔT of clock signal input by installing phase shifters. Furthermore, timing of inputting digital signals to the switch circuits may be adjusted by changing signal wiring lengths between the switch circuits (12-1 to 12-N) and the DFFs (40-1 to 40-N) or installing phase shifters.

Fifth Embodiment

Ultra-high speed digital-to-analog converters may incorporate a multiplexer circuit (MUX) that time-multiplexes digital signals in their chips. In this case, timing of digital signals to be inputted to the core circuit of the digital-to-analog converter is controlled not by the DFF but by the MUX. Embodiments of the present invention are also applicable to digital-to-analog converters provided with such a MUX function in the chips.

Figure 11:
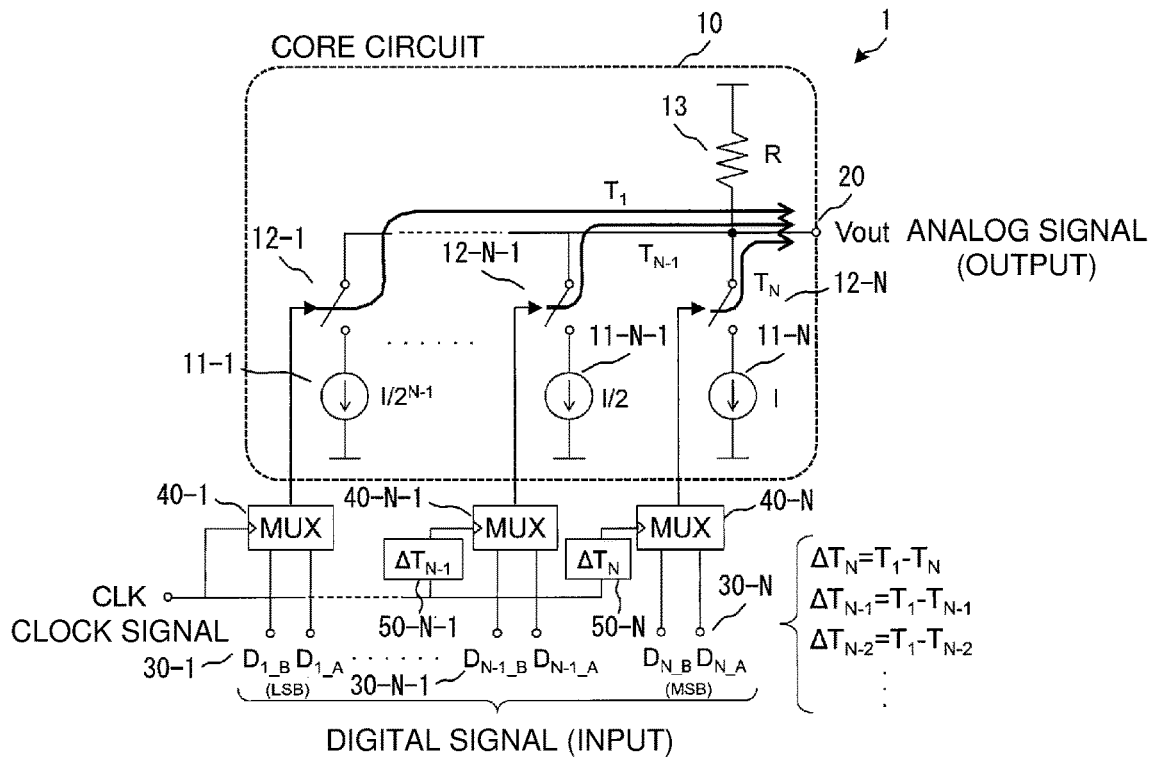
FIG. 11 is a diagram illustrating a configuration example of a digital-to-analog converter according to the fourth embodiment of the present invention.
Figure 12:
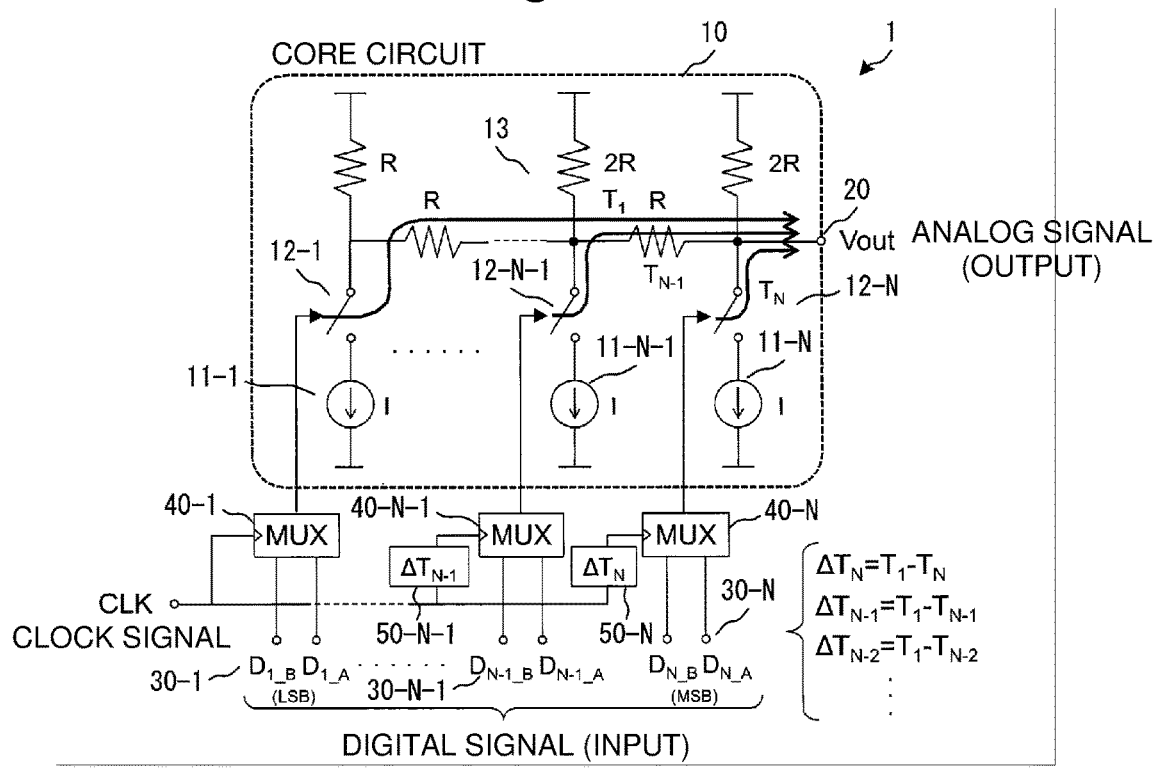
FIG. 12 is a diagram illustrating another configuration example of the digital-to-analog converter according to the fourth embodiment of the present invention.

FIGS. 11 and 12 illustrate configuration examples of a digital-to-analog converter according to a fifth embodiment of the present invention. The digital-to-analog converters in FIGS. 11 and 12 are N-bit digital-to-analog converters provided with MUXs.

In the digital-to-analog converter 1 provided with the MUXs, since the MUXs (40-1 to 40-N) determine timing of inputting digital signals to the core circuit 10, the digital-to-analog converter 1 may be configured so as to give a time difference corresponding to a difference in a propagation time inside the core circuit 10 to clock signals to be inputted to the MUXs (40-1 to 40-N). Specific configurations of the adjustment circuits (50-N−1, 50-N) to give time differences are similar to the configurations used in the first to fourth embodiments.

The MUXs (40-1 to 40-N) of the digital-to-analog converter 1 in FIGS. 11 and 12 are provided with a 2:1 MUX function, but the MUXs may also be provided with a 4:1 MUX function or a MUX function with a higher ratio. The switch circuits (12-1 to 12-N) may be constructed of a differential switch circuit using transistor differential pairs just as in the case of the aforementioned digital-to-analog converter using DFFs.

Figure 14:
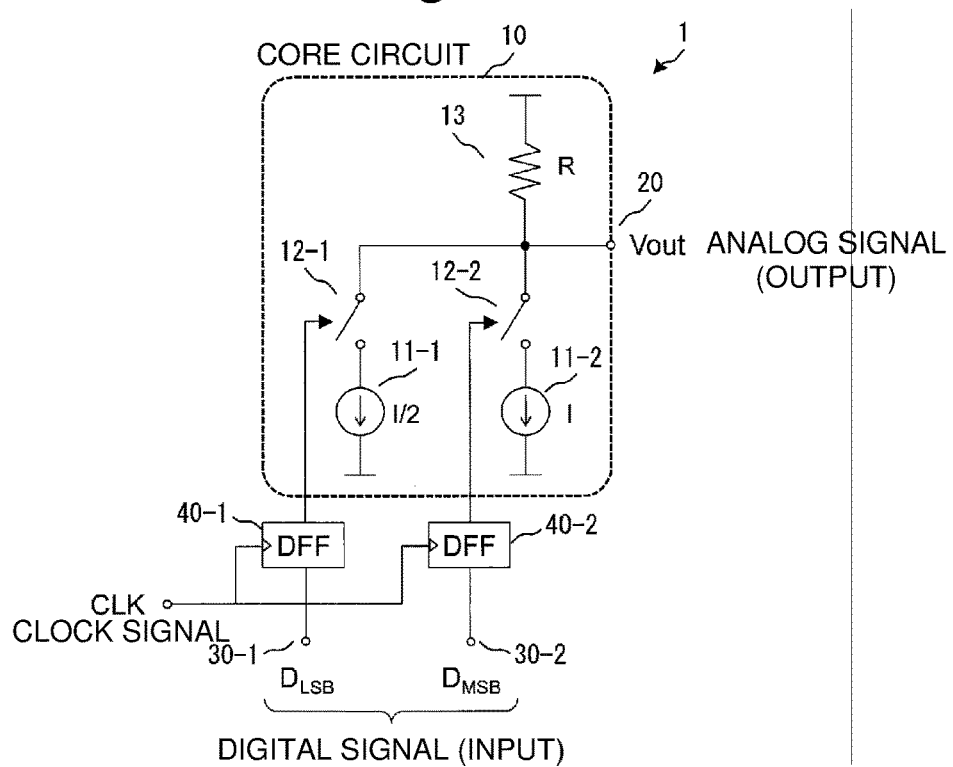
FIG. 14 is a diagram illustrating a configuration example of a conventional digital-to-analog converter.
Figure 15:
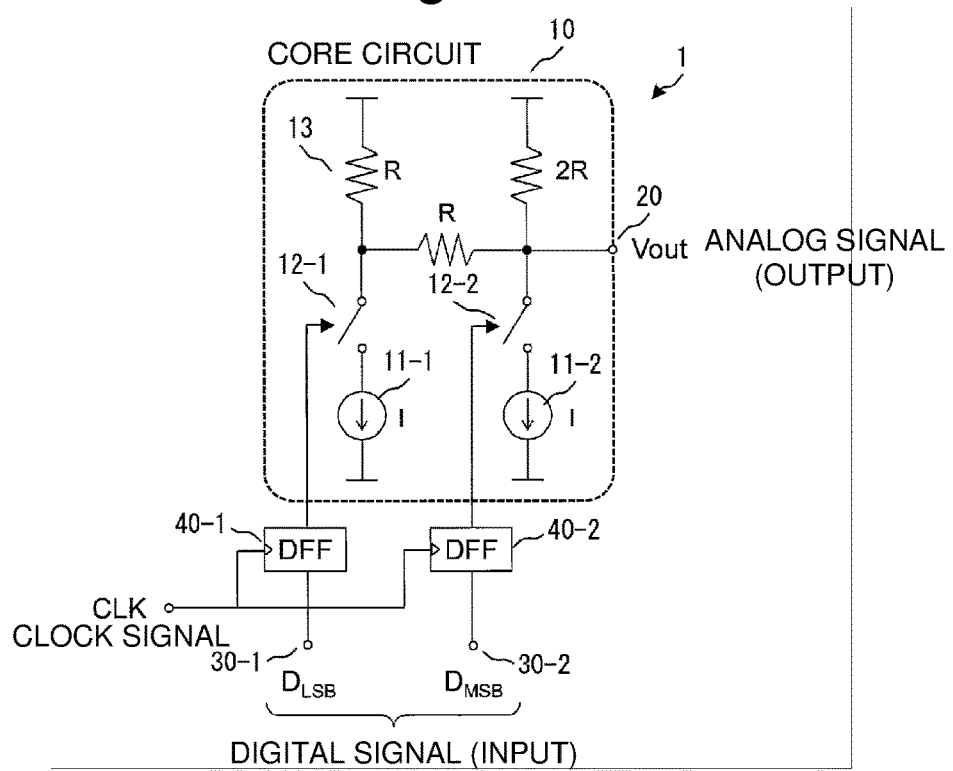
FIG. 15 is a diagram illustrating another configuration example of the conventional digital-to-analog converter.

Note that although configuration examples applicable to two conventional digital-to-analog converters as shown in FIG. 14 and FIG. 15 have been described in the present embodiment, it goes without saying that the technique of the present embodiment is also applicable to other digital-to-analog converters having similar configurations.

Figure 13A:
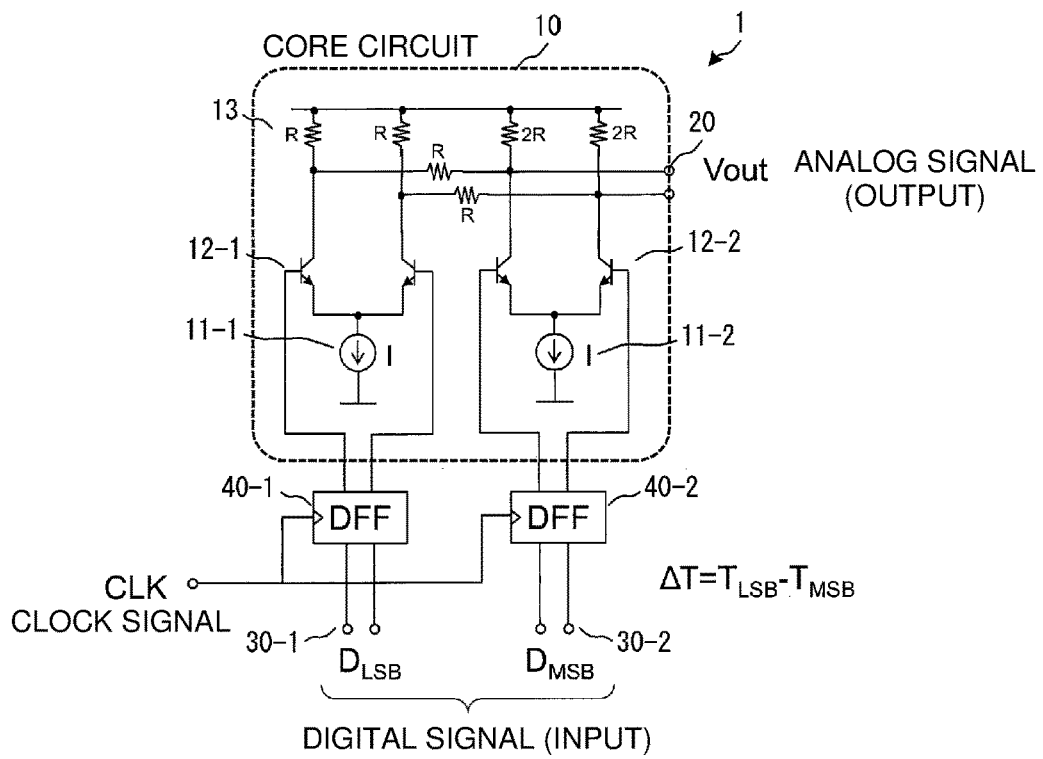
FIG. 13A is a diagram illustrating a configuration example of a conventional digital-to-analog converter.
Figure 13B:
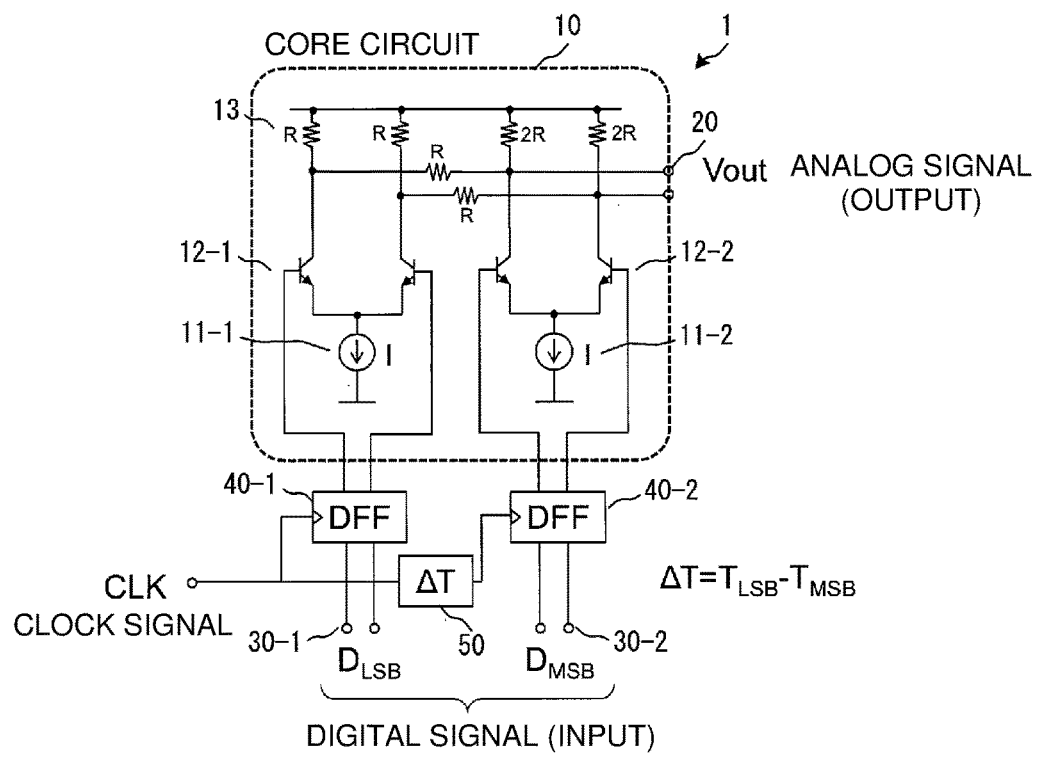
FIG. 13B is a diagram illustrating a configuration example of the digital-to-analog converter according to the embodiment of the present invention.
Figure 13C:
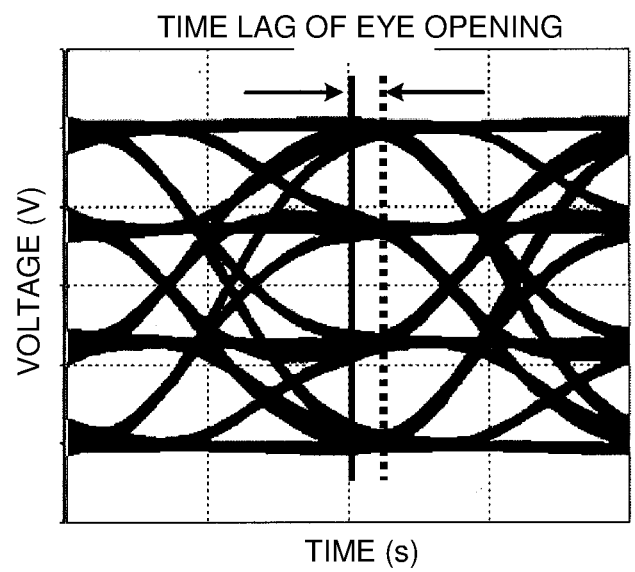
FIG. 13C illustrates an example of a simulation result in a conventional digital-to-analog converter.
Figure 13D:
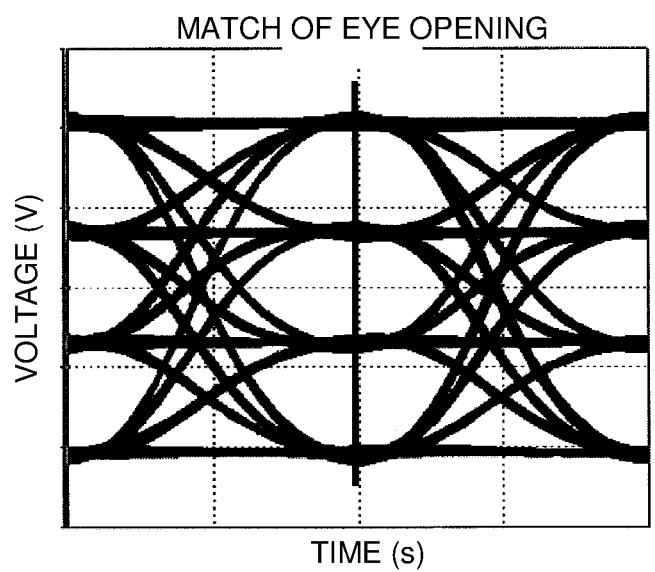
FIG. 13D illustrates an example of a simulation result illustrating an improvement effect on waveform distortion of the digital-to-analog converter according to the embodiment of the present invention.

Effects of correcting waveform distortion according to an embodiment of the present invention will be described using FIG. 13A to FIG. 13D. FIG. 13A illustrates the conventional digital-to-analog converter 1 without any compensation for difference in propagation delay inside the core circuit 10 and FIG. 13B illustrates the digital-to-analog converter 1 according to the embodiment of the present invention with a difference in propagation delay compensated inside the core circuit 10. FIG. 13C illustrates a result of simulation conducted in the conventional digital-to-analog converter for generating a 100 GBaudPAM 4 signal by a 100 GS/s operation. FIG. 13D illustrates a result of simulation conducted in the digital-to-analog converter 1 according to the embodiment of the present invention for generating a 100 GBaudPAM 4 signal by a 100 GS/s operation.

In the conventional digital-to-analog converter 1, a time lag (waveform distortion) is generated at an eye opening due to a difference in propagation delay produced inside the core circuit 10, whereas in the digital-to-analog converter 1 of the present embodiment, it is possible to confirm that the difference in the propagation time is compensated inside the core circuit 10 and the time lag (waveform distortion) at the eye opening has been corrected.

As described so far, according to the embodiments of the present invention, it is possible to provide a digital-to-analog converter capable of generating an analog signal with less distortion even during an ultra-high speed conversion operation.

Reference Signs List

1 digital-to-analog converter
10 core circuit
11-1 to 11-N constant current source
12-1 to 12-N switch circuit
13 load resistor
14-1, 14-2 degenerative resistor
15-1, 15-2 cascode transistor
20 output terminal
30-1 to 30-N input terminal
40-1 to 40-N timing adjustment circuit
50, 50-N−1, 50-N adjustment circuit.

The invention claimed is:

1. A digital-to-analog converter comprising:
a core circuit comprising:
a plurality of input terminals for receiving multi-bit digital signals;
an output terminal for transmitting an analog signal;
a plurality of constant current sources;
a plurality of switch circuits, each of the plurality of switch circuits being connected in series to a respective constant current source of the plurality of constant current sources; and
a load resistor connected to the output terminal, the core circuit being configured to:
select whether or not to allow a current to flow through each of the plurality of switch circuits based on the multi-bit digital signals; and
output a voltage generated by allowing the current flowing through the plurality of switch circuits through the load resistor from the output terminal as the analog signal;
a plurality of timing adjustment circuits, each of the plurality of timing adjustment circuits being disposed between a respective input terminal of the plurality of input terminals and a respective switch circuit of the plurality of switch circuits, each of the plurality of timing adjustment circuits being configured to adjust a respective timing of inputting the multi-bit digital signals to each of the plurality of switch circuits; and
an adjustment circuit configured to adjust the respective timing of inputting the multi-bit digital signals to each of the plurality of switch circuits so as to offset a difference in a propagation time of a respective signal from each of the plurality of switch circuits to the output terminal.

2. The digital-to-analog converter according to claim 1, wherein:
the plurality of timing adjustment circuits operate based on a clock signal, and
the adjustment circuit adjusts a timing of inputting the clock signal to the plurality of timing adjustment circuits so as to offset the difference in the propagation time of the respective signal from each of the plurality of switch circuits to the output terminal.

3. The digital-to-analog converter according to claim 2, wherein the adjustment circuit is a clock signal wire that inputs the clock signal to the plurality of timing adjustment circuits.

4. The digital-to-analog converter according to claim 2, wherein the adjustment circuit is a phase shifter between an input terminal of the clock signal and the plurality of timing adjustment circuits.

5. The digital-to-analog converter according to claim 1, wherein the adjustment circuit is a signal wire between the plurality of timing adjustment circuits and the plurality of switch circuits.

6. The digital-to-analog converter according to claim 1, wherein the adjustment circuit is a phase shifter between the plurality of timing adjustment circuits and the plurality of switch circuits.

7. The digital-to-analog converter according to claim 1, wherein each of the plurality of switch circuits is a differential switch circuit comprising two switch elements connected to each of the plurality of constant current sources.

8. The digital-to-analog converter according to claim 1, wherein each of the plurality of timing adjustment circuits is a D flip-flop circuit or a multiplexer circuit.

9. A method comprising:
selecting, by a core circuit, whether or not to allow a current to flow through each of a plurality of switch circuits based on multi-bit digital signals, wherein the core circuit comprises:

a plurality of input terminals for receiving the multi-bit digital signals;
an output terminal for transmitting an analog signal;
a plurality of constant current sources;
the plurality of switch circuits, each of the plurality of switch circuits being connected in series to a respective constant current source of the plurality of constant current sources; and
a load resistor connected to the output terminal; and
output, by the core circuit, a voltage generated by allowing the current flowing through the plurality of switch circuits through the load resistor from the output terminal as the analog signal;
adjusting, by a plurality of timing adjustment circuits, a respective timing of inputting the multi-bit digital signals to each of the plurality of switch circuits, each of the plurality of timing adjustment circuits being disposed between a respective input terminal of the plurality of input terminals and a respective switch circuit of the plurality of switch circuits; and
adjusting, by an adjustment circuit, the respective timing of inputting the multi-bit digital signals to each of the plurality of switch circuits so as to offset a difference in a propagation time of a respective signal from each of the plurality of switch circuits to the output terminal.

10. The method according to claim 9, wherein:
the plurality of timing adjustment circuits operate based on a clock signal, and
the adjustment circuit adjusts a timing of inputting the clock signal to the plurality of timing adjustment circuits so as to offset the difference in the propagation time of the respective signal from each of the plurality of switch circuits to the output terminal.

11. The method according to claim 10, wherein the adjustment circuit is a clock signal wire that inputs the clock signal to the plurality of timing adjustment circuits.

12. The method according to claim 10, wherein the adjustment circuit is a phase shifter between an input terminal of the clock signal and the plurality of timing adjustment circuits.

13. The method according to claim 9, wherein the adjustment circuit is a signal wire between the plurality of timing adjustment circuits and the plurality of switch circuits.

14. The method according to claim 9, wherein the adjustment circuit is a phase shifter between the plurality of timing adjustment circuits and the plurality of switch circuits.

15. The method according to claim 9, wherein each of the plurality of switch circuits is a differential switch circuit comprising two switch elements connected to each of the plurality of constant current sources.

16. The method according to claim 9, wherein each of the plurality of timing adjustment circuits is a D flip-flop circuit or a multiplexer circuit.

* * * * *